US010041968B2

(12) United States Patent
Nulty

(10) Patent No.: US 10,041,968 B2
(45) Date of Patent: Aug. 7, 2018

(54) POWER LINE MANAGEMENT SYSTEM

(71) Applicant: Aclara Technologies LLC, Hazelwood, MO (US)

(72) Inventor: Gregory M. Nulty, Reston, VA (US)

(73) Assignee: ACLARA TECHNOLOGIES LLC, St. Louis, MO (US)

( * ) Notice: Subject to any disclaimer, the term of this patent is extended or adjusted under 35 U.S.C. 154(b) by 0 days.

(21) Appl. No.: 15/294,545

(22) Filed: Oct. 14, 2016

(65) Prior Publication Data

US 2017/0030943 A1 Feb. 2, 2017

Related U.S. Application Data

(63) Continuation of application No. 13/766,524, filed on Feb. 13, 2013, now Pat. No. 9,562,925.

(60) Provisional application No. 61/598,664, filed on Feb. 14, 2012.

(51) Int. Cl.
*G01P 15/02* (2013.01)
*H02J 3/00* (2006.01)
*H02J 13/00* (2006.01)
*G01R 31/02* (2006.01)

(52) U.S. Cl.
CPC ............ *G01P 15/02* (2013.01); *G01R 31/021* (2013.01); *H02J 3/00* (2013.01); *H02J 13/00* (2013.01); *H02J 13/002* (2013.01); *H02J 2003/001* (2013.01); *H02J 2003/007* (2013.01); *Y02E 60/74* (2013.01); *Y02E 60/76* (2013.01); *Y04S 10/30* (2013.01); *Y04S 10/525* (2013.01); *Y04S 40/22* (2013.01)

(58) Field of Classification Search
CPC ..... G01P 15/02; H02J 13/00; H02J 2003/001; H02J 2003/007; H02J 3/00; Y02E 60/76; Y04S 10/30; Y04S 10/525; Y04S 40/22
See application file for complete search history.

(56) References Cited

U.S. PATENT DOCUMENTS

| 3,777,217 A | 12/1973 | Groce et al. |
| 4,420,752 A | 12/1983 | Davis et al. |
| 4,581,606 A | 4/1986 | Mallory |
| 4,689,752 A | 8/1987 | Fernandes et al. |

(Continued)

FOREIGN PATENT DOCUMENTS

| EP | 0 026 801 A1 | 4/1981 |
| EP | 1 505 706 A2 | 2/2005 |

(Continued)

OTHER PUBLICATIONS

International Search Report and Written Opinion for International Application No. PCT/US2013/025946, dated May 29, 2013.

(Continued)

*Primary Examiner* — Natalie Huls
(74) *Attorney, Agent, or Firm* — Polsinelli PC

(57) ABSTRACT

Techniques comprising obtaining, using a sensor unit coupled to a power line in a power distribution system, at least one measurement of at least one inertial property of the power line; and detecting at least one condition of the power line at least in part by analyzing the at least one measurement. A sensor unit configured to be coupled to a power line in a power distribution system, the sensor unit comprising an inertial sensor configured to collect at least one measurement of at least one inertial property of the power line.

10 Claims, 4 Drawing Sheets

(56) References Cited

U.S. PATENT DOCUMENTS

| | | |
|---|---|---|
| 4,709,339 A | 11/1987 | Fernandes |
| 4,728,887 A | 3/1988 | Davis |
| 4,801,937 A | 1/1989 | Fernandes |
| 4,808,917 A | 2/1989 | Fernandes et al. |
| 4,829,298 A | 5/1989 | Fernandes |
| 5,006,846 A | 4/1991 | Granville et al. |
| 5,235,861 A | 8/1993 | Seppa |
| 5,426,360 A | 6/1995 | Mario et al. |
| 5,684,507 A | 11/1997 | Rasnake et al. |
| 5,684,508 A | 11/1997 | Brilman |
| 5,684,710 A | 11/1997 | Ehlers et al. |
| 5,708,679 A | 1/1998 | Fernandes et al. |
| 5,715,058 A | 2/1998 | Bohnert et al. |
| 5,729,144 A | 3/1998 | Cummins |
| 5,995,911 A | 11/1999 | Hart |
| 6,005,759 A | 12/1999 | Hart et al. |
| 6,205,867 B1 | 3/2001 | Hayes et al. |
| 6,301,514 B1 | 10/2001 | Canada et al. |
| 6,535,797 B1 | 3/2003 | Bowles et al. |
| 6,597,180 B1 | 7/2003 | Takaoka et al. |
| 6,660,934 B1 | 12/2003 | Nourai et al. |
| 6,751,562 B1 | 6/2004 | Blackett et al. |
| 6,940,702 B2 | 9/2005 | Kojovic et al. |
| 7,135,580 B2 | 3/2006 | Bonrath et al. |
| 7,058,524 B2 | 6/2006 | Hayes et al. |
| 7,075,308 B2 | 7/2006 | Rockwell |
| 7,135,850 B2 | 7/2006 | Ramirez |
| 7,468,661 B2 | 12/2008 | Petite et al. |
| 7,714,735 B2 | 5/2010 | Rockwell |
| 7,987,071 B1 | 7/2011 | Dorfman et al. |
| 8,103,466 B2 | 1/2012 | Taft |
| 8,536,857 B2 | 9/2013 | Nero, Jr. |
| 8,587,445 B2 | 11/2013 | Rockwell |
| 8,896,291 B2 | 11/2014 | Nero, Jr. |
| 8,941,491 B2 | 1/2015 | Polk et al. |
| 9,069,009 B2 | 6/2015 | Nero, Jr. |
| 9,158,036 B2 | 10/2015 | Liu et al. |
| 2002/0038199 A1 | 3/2002 | Blemel |
| 2003/0161084 A1 | 8/2003 | Potts et al. |
| 2003/0216876 A1 | 11/2003 | Premeriani et al. |
| 2004/0169171 A1 | 9/2004 | Reeves et al. |
| 2005/0017751 A1 | 1/2005 | Gunn et al. |
| 2005/0145018 A1 | 7/2005 | Sabata et al. |
| 2005/0151659 A1 | 7/2005 | Donovan et al. |
| 2005/0171647 A1 | 8/2005 | Kunsman et al. |
| 2005/0191647 A1 | 9/2005 | Kunsman et al. |
| 2006/0056370 A1 | 3/2006 | Hancock et al. |
| 2006/0077918 A1 | 4/2006 | Mao et al. |
| 2006/0275532 A1 | 12/2006 | Dechert |
| 2007/0059986 A1 | 3/2007 | Rockwell |
| 2008/0036620 A1 | 2/2008 | McCollough |
| 2009/0027932 A1 | 1/2009 | Haines et al. |
| 2009/0138229 A1 | 5/2009 | Engelhardt et al. |
| 2009/0243876 A1 | 10/2009 | Lilien et al. |
| 2010/0013457 A1 | 1/2010 | Nero, Jr. |
| 2010/0114392 A1 | 5/2010 | Lancaster |
| 2010/0152910 A1 | 6/2010 | Taft |
| 2010/0188239 A1 | 7/2010 | Rockwell |
| 2010/0237852 A1 | 9/2010 | Tazzari et al. |
| 2011/0082596 A1 | 4/2011 | Meagher et al. |
| 2011/0187578 A1 | 8/2011 | Farneth et al. |
| 2011/0238374 A1 | 9/2011 | Lancaster |
| 2011/0282508 A1 | 11/2011 | Goutard et al. |
| 2011/0288777 A1 | 11/2011 | Gupta |
| 2012/0029871 A1 | 2/2012 | Spillane |
| 2012/0046799 A1 | 2/2012 | Alex et al. |
| 2012/0278011 A1 | 11/2012 | Lancaster |
| 2013/0050478 A1 | 2/2013 | Tadepalli |
| 2013/0054162 A1 | 2/2013 | Smith et al. |
| 2013/0054183 A1 | 2/2013 | Afzal et al. |
| 2013/0134998 A1 | 5/2013 | Kiko et al. |
| 2013/0205900 A1 | 8/2013 | Nulty |
| 2013/0328546 A1 | 12/2013 | Nero, Jr. |
| 2014/0052388 A1 | 2/2014 | Mahlen et al. |
| 2014/0136140 A1 | 5/2014 | Chan et al. |
| 2014/0143578 A1 | 5/2014 | Cenizal et al. |
| 2014/0163884 A1 | 6/2014 | Lilien et al. |
| 2014/0288863 A1 | 9/2014 | Stevenin |
| 2015/0069998 A1 | 3/2015 | Nero, Jr. |
| 2015/0276818 A1 | 10/2015 | Nulty |
| 2016/0061862 A1 | 3/2016 | Nulty |

FOREIGN PATENT DOCUMENTS

| | | |
|---|---|---|
| EP | 2 081 273 A2 | 7/2009 |
| GB | 367 244 A | 2/1932 |
| GB | 1 501 351 A | 2/1978 |
| JP | 2004/168914 A | 6/1992 |
| JP | 2006/102308 A | 4/1994 |
| JP | 08265959 A | 10/1996 |
| JP | 2010/054863 | 2/1998 |
| WO | WO 99/42844 A1 | 8/1999 |
| WO | WO 00/60367 A1 | 10/2000 |
| WO | WO 01/09628 A1 | 2/2001 |
| WO | WO 2004/068151 A1 | 8/2004 |
| WO | WO 2005/019846 A1 | 3/2005 |
| WO | WO 2005/067686 A2 | 7/2005 |
| WO | WO 2005/091958 A2 | 10/2005 |
| WO | WO 2006/021030 A1 | 3/2006 |
| WO | WO 2006/031739 A2 | 3/2006 |
| WO | WO 2006/092632 A2 | 9/2006 |
| WO | WO 2007/134022 A2 | 11/2007 |
| WO | WO 2009/120537 A1 | 10/2009 |
| WO | WO 2010/127145 A1 | 4/2010 |
| WO | WO 2011/000754 A1 | 1/2011 |
| WO | WO 2013/033387 A1 | 3/2013 |
| WO | WO 2013/076975 A1 | 5/2013 |
| WO | WO 2014/088562 A1 | 6/2014 |
| WO | WO 2014/105018 A2 | 7/2014 |

OTHER PUBLICATIONS

International Preliminary Report on Patentability for Application PCT/US2013/025946 dated Aug. 28, 2014.

International Search Report and Written Opinion for Application No. PCT/US2012/053106 dated Jan. 4, 2013.

International Preliminary Report on Patentability for Application No. PCT/US2012/053106 dated Mar. 13, 2014.

International Search Report and Written Opinion for Application No. PCT/US2012/053125 dated Jan. 4, 2013.

International Preliminary Report on Patentability for Application No. PCT/US2012/053125 dated Mar. 13, 2014.

International Search Report and Written Opinion for Application No. PCT/US2012/067285 dated Mar. 27, 2013.

International Preliminary Report on Patentability and Written Opinion for Application No. PCT/US2012/067285 dated Jun. 12, 2014.

International Search Report and Written Opinion for Application No. PCT/US2015/023467 dated Oct. 5, 2015.

International Search Report and Written Opinion for Application No. PCT/US2015/047404 dated Dec. 10, 2015.

[No Author Listed] ABB Improves Grid Reliability in Algeria. Edited Jun. 13, 2006. Last accessed on Dec. 11, 2006 at : http://www.abb.com/cawp/seitp202/d18e8cf73169fbc125714900427925.aspx? 2 pages.

[No Author Listed] Cooper Power Systems, S.T.A.R. Faulted Circuit Indicators. Bulletin No. 98025. Jun. 1998. 2 pages.

[No Author Listed] GridSense website http://www.gridsense.net/products_It30.shtml. Aug. 4, 2006. 5 pages.

[No Author Listed] Sensors, Controls, and Communications. U.S. Climate Change Technology Program—Technology Options for the Near and Long Term. Aug. 2005;1(3). 3 pages.

Brambley et al., Wireless Sensor Applications for Buildings Operation and Management. Http://www.buildingsystemsprogram.pnl.gov/wireless/publications/pnnl-sa-43465.pdf. 2005. 40 pages.

Doig et al., Reclassification of Relay-Class Current Transformers for Revenue Metering Applications. © 2005 IEEE Reprinted from the proceeding of the IEEE T&D PES Conference. 8 pages.

Govindarasu et al., SST-Sensor Network Design for a Secure National Electric Energy Infracture, Iowa State University,

(56) References Cited

OTHER PUBLICATIONS

Department of Electrical Engineering, 2004. http://www.eng.iastate.edu/abstactsvieewabstact.asp?id=1920.

Hacker et al., Securing America's Power Grid. Iowa State University: News Service. Jun. 26, 2006. http://www.iastate.edu~nscentral//news/2006/jun/grid.shtml. 2 pages.

Nordman et al., Design of a Concept and a Wireless ASIC Sensor for Locating Earth Faults in Unearthed Electrical Distribution Networks. IEEE Transactions on Power Delivery. 2006;21(3):1074-82.

Nordman, An Architecture for Wireless Sensors in Distributed Management of Electrical Distribution Systems. Helsinki University of Technology. Http://lib.tkk.fi/Diss/2004/isbn9512272989.pdf. Nov. 19, 2004. 74 pages.

Ozaki et al., A Fault-Tolerant Model for Wireless Sensor-Actor System. IEEE Computer Society, Proceedings of 20th International Conference on Advance Information Networking and Applications. 2006. 5 pages.

Poisson et al., Detection and measurement of power quality disturbances using wavelet transform. IEEE Transactions of Power Delivery. Jul. 2000;15(3):1039-44.

Risley et al., Electronic Security Risks Associated With Use of Wireless, Point-To-Point Communications in the Electric Power Industry. 2003. 16 pages.

Santoso et al., Power quality assessment via wavelet transform analysis. IEEE Transaction on Power Delivery. Apr. 1996;11(2):924-30.

Solodovnik et al., Wireless Sensing and Controls for Survivable AC Zonal System. 2004. http://www.actapress.com/PaperInfo.aspx?PaperID=17901. 2 pages.

Sun et al., Fault-Tolerant Cluster-Wise Clock Synchronization for Wireless Sensor Networks, IEEE Transactions on Dependable and Secure Computing. 2005;2(3):177-89.

Sushama et al., Detection of power quality disturbances using wavelet transforms. Int J Computer. 2010;18(1):61-6.

JP 08265959 A (English Translation), Oct. 11, 1996, pp. 1-5.

POWER LINE MANAGEMENT SYSTEM

CROSS-REFERENCE TO RELATED APPLICATIONS

The present application is a continuation of and claims priority under 35 U.S.C. § 120 to U.S. application Ser. No. 13/766,524, filed Feb. 13, 2013, titled "POWER LINE MANAGEMENT SYSTEM," which claims the benefit under 35 U.S.C. § 119(e) of U.S. Provisional Application Ser. No. 61/598,664, filed on Feb. 14, 2012, titled "Power Line Management System," which are hereby incorporated by reference in their entireties.

BACKGROUND

Power lines are widely used in many settings. They form an important part of the power distribution system, carrying power from generation facilities all the way to the locations where it is used. The distribution system may include many types of power lines, with high voltage lines used closer to the generation facilities and medium and lower voltage lines closer to the locations where the power is used.

Many of the lines run "overhead," meaning that the lines are attached to towers or poles to elevate the lines above the ground. High voltage lines are generally routed through open spaces, but the medium and low voltage lines, which are closer to the homes and businesses that use the power, are more likely to run over roads and near trees or other objects.

A power company may spend significant amounts of money repairing and maintaining these power lines. Environmental conditions, for example, may damage the lines. For example, ice and snow build up on a power line may load the line to the point that it stretches and breaks. Wind can also be a contributing factor to breakage or wear of a power line. Wind can directly cause damage to a line or can cause tree limbs or other obstacles to come in contact with the line, thus damaging it.

Further, power lines can experience damage or wear through overloading. When large amounts of current flow through a power line, the line may heat up, causing the line to stretch. Too much stretching may, in turn, lead to breakage of the line and, as such, create a dangerous scenario for people and property under an overhead line and lead to breakage of the line.

Accordingly, a power company may devote significant personnel and financial resources to checking power lines for the presence of these conditions and addressing the resulting issues.

SUMMARY

Improved power line management is facilitated through a system that collects data about power lines from multiple locations in a power distribution system. The data may be aggregated and analyzed to determine current conditions of power lines requiring maintenance and/or to predict a time at which maintenance is likely to be required for one or more power lines. This information may be used to schedule maintenance operations and the locations at which that maintenance is to be performed.

A system for detecting or predicting conditions on power lines may include multiple sensor units attached to the power lines. Each sensor unit may contain multiple types of sensors. Processing of data collected by the sensor units may include correlating and jointly processing different types of sensor data derived from the same sensor units or different sensor units.

Accordingly, in some aspects, the invention may be embodied as a sensor unit for a power line incorporating multiple types of sensors. The sensors may measure electrical properties associated with a power line. In addition, one or more mechanical properties may be measured, such as temperature. Additionally or alternatively, inertial properties, such as acceleration and/or inclination may be measured. In some embodiments, each of the sensor units may include a radio, allowing measurements from a sensor unit to be communicated to a computing device or multiple computing devices, where data from multiple sensor units may be analyzed.

In another aspect, the invention may be embodied as a method of managing a power distribution system. The method may include collecting measurements from multiple sensors attached to power lines throughout the distribution system and correlating those measurements to identify or predict faults or other conditions requiring maintenance to the power distribution system.

In yet another aspect, the invention may be embodied as computer executable instructions stored on a non-transitory computer readable medium. The instructions may control analysis of sensor data and generation of indications or predictions of fault conditions at locations throughout the power distribution system. The foregoing is a non-limiting summary of the invention.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

The inventors have recognized and appreciated improvements in power line management that can be achieved with a power line monitoring and diagnostic system equipped with one or more sensor units that are equipped with an inertial sensor (such as an accelerometer and/or inclinometer). Such a system may more readily predict power outages or identify conditions within a power distribution system requiring maintenance or otherwise being out-of-tolerance. These predictions may be used to schedule maintenance to avoid a power outage, avoid unsafe conditions (such as downed cables or overhead cables that sag to the point that a person or objects below the cable are at risk of contact with the cables) or to otherwise address the conditions, thereby avoiding service disruptions and/or allowing efficient dedication of service resources by an entity or entities responsible for maintaining the power distribution network. For example, out-of-tolerance conditions may be addressed proactively through preventative maintenance rather than as a costly or time-consuming repair after an actual failure has occurred.

The sensor units may be mechanically coupled to cables at one or more locations throughout the power line network. As a result, the inertial sensor within the sensor unit may make measurements of inertial properties of the cables, such as orientation, velocity, acceleration, etc. The measurements may be analyzed to determine a rate of change of an inertial property of a cable. These measurements from one sensor unit may be used alone or in combination with measurements made with other sensor units to diagnose and/or predict conditions on a power cable or cables within an electrical distribution network.

In some embodiments, the sensors may, in addition to measuring inertial properties of a power line, measure any of numerous other conditions associated with power lines. For example, a sensor unit may measure electrical conditions on a power line. As another example, other sensors within a sensor unit may measure temperature.

It should be appreciated, however, that the specific types of sensors contained within each sensor unit is not critical to the invention. Any suitable combination of sensors may be used in each sensor unit. Moreover, different sensor units may contain different types of sensors.

Figure 1:
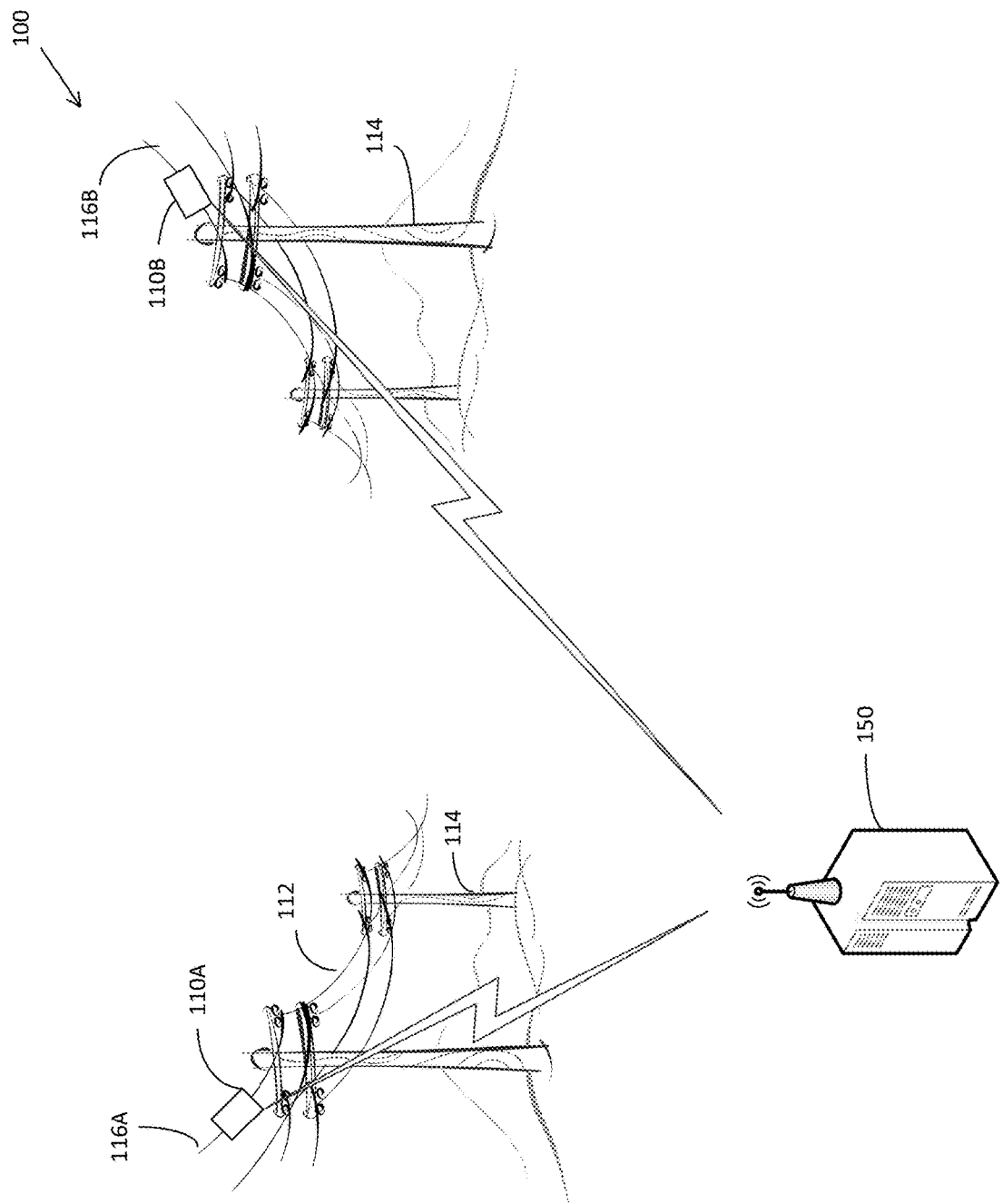
FIG. 1 is a schematic illustration of a power distribution system equipped with components for detecting or predicting a need for power line maintenance.

FIG. 1 illustrates an environment in which the techniques described herein for detecting and/or predicting a need for power line maintenance may be applied. Here, a power distribution network 100 is illustrated. Such a network includes multiple overhead lines 112. The overhead lines may be supported by poles 114. As a result, each of the lines 112 may have multiple segments, such as segments 116A and 116B, between the locations where the wires are attached to the poles.

Sensor units may be attached to some or all of the segments. In the example illustrated in FIG. 1, sensor units 110A and 110B are shown as being attached to segments 116A and 116B of lines 112. In this example, sensor units are attached to a subset of the line segments. Though, in some embodiments, a sensor unit may be attached to every line segment. In other embodiments, sensor units may be selectively attached to line segments. For example, sensor units may be selectively attached to line segments that have characteristics representative of line segments in a larger area (e.g., such line segments may be in locations having environmental conditions representative of environmental conditions of other line segments in a larger area). As another example, sensor units may be selectively placed on line segments that are in locations carrying a greater risk of failure, such as windy locations, locations prone to ice buildup, locations exposed to tree incursions, high heat index areas prone to circuit overloading, spans carrying two or more distribution circuits, or posing a greater risk to people or objects below the line segments if a failure should occur, such as line segments spanning busy intersections. In some embodiments, multiple sensor units may be coupled on one line segment. Thus, it should be appreciated that the number and locations of sensor units within power distribution network 100 is not critical to the invention.

It also should be appreciated that FIG. 1 shows a simplified representation of a power distribution system. A power distribution system may have many more poles and many more lines than illustrated. Moreover, FIG. 1 illustrates medium voltage lines. In some embodiments, sensor units may be preferentially attached to medium voltage lines because of the proximity of medium voltage lines to trees and other objects that could come into contact with the lines. Medium voltage lines also may be well suited for placement of sensor units because of the proximity of those lines to people or other objects that could be injured or damaged if a fault were to occur on such a line. Though, it should be appreciated that the specific type and structure of the lines to which sensor units are attached is not critical to the invention. Sensor units may be attached to any suitable type of line, including cables of various types.

Regardless of the numbers and locations of sensor units, data collected at each sensor unit may be communicated to one or more computing devices for processing to detect and/or predict a need for maintenance on one or more of the power lines. In the example of FIG. 1, data from the sensor units is wirelessly communicated to computing device 150. In this example, a single computing device collecting data from all of the sensors is illustrated. Though, it should be appreciated that in a power distribution network spanning a large area, multiple computing devices may be used to collect and process data from the sensors.

If multiple devices are used, they may be located in one location or distributed across multiple locations. In the latter case, they may be organized hierarchically such that each computing device in the hierarchy may be configured to collect and process data gathered by a subset of sensor units. For example, one computing device may be configured to collect and process data from sensor units in one geographic region and another computing device may be configured to collect and process data from sensor units in another geographic region.

FIG. 1 also shows data being transmitted directly from each sensor unit to computing device 150. In some embodiments, the data may be transmitted through one or more intermediary devices and/or a network of any suitable type. Moreover, FIG. 1 illustrates wireless communication as an example of a communications mechanism that may be employed. Any suitable communication mechanism may be used. For example, in some embodiments, the data may be communicated in whole or in part over the power lines themselves. As a specific example, a sensor unit connected to a central data collection point, such as computing device 150, through a power line, may transmit data over that power line. If a fault or other condition prevents communication over the power line, the sensor unit may transmit data wirelessly to the central location directly or indirectly through another sensor unit, a network, or other suitable intermediary device. Accordingly, it should be appreciated that the specific communications mechanism employed is not critical to the invention.

Each sensor unit may contain one or more types of sensors and circuitry for controlling the collection of data and transmission of that data for analysis. In some embodiments, each sensor unit may contain circuitry for processing the data prior to transmission. The processing may, for example, result in the compression of the collected data to reduce the amount of data transmitted. Any suitable type of data compression techniques may be used. Data may be compressed by using lossless or lossy compression techniques. Data may be compressed, for example, by extraction of features or parameters characterizing signals measured by sensors including any time-varying signals measured by the sensors. A further form of compression may entail transmission of samples of sensor data from time to time. The times at which sensor data is transmitted may be periodic or may the determined dynamically based on detection of changing conditions. For example, sensor data may be transmitted when there is a change in the environmental conditions (e.g., a snow storm arrives, a tree falls, it becomes windy, etc.). Accordingly, in some embodiments, not all sensor data may be transmitted. Rather a determination may be made (e.g., by the sensor unit) whether to transmit data from the sensor unit. Such a determination may be made using any suitable technique, for example, by deriving a value from the data (e.g., an average or any other suitable statistical quantity or quantities) and determining whether the derived value exceeds a threshold. In this way, sensor data may be transmitted when it is indicative of a change in a condition of a power line to which the sensor unit is coupled.

Figure 2:
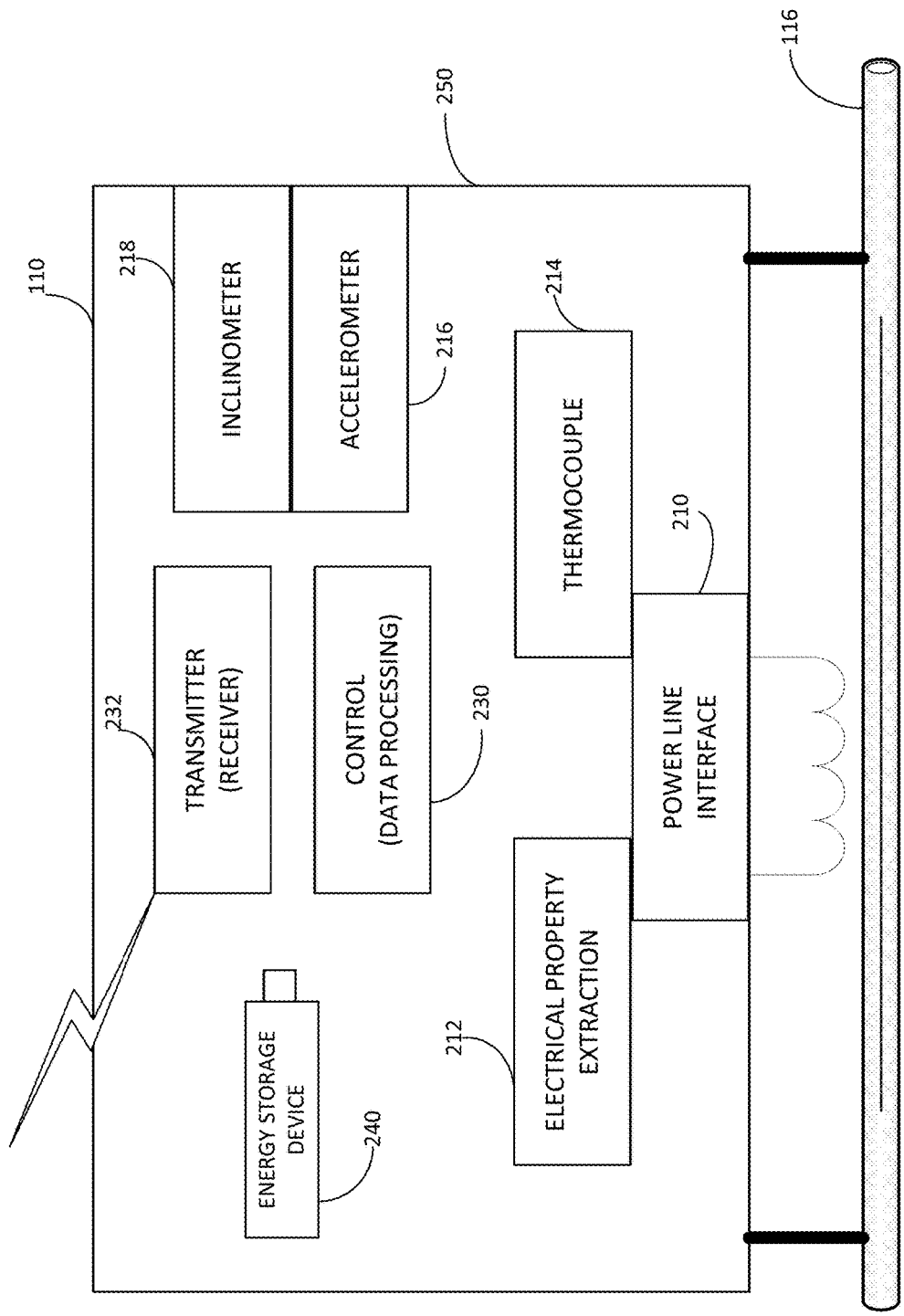
FIG. 2 is a functional block diagram of a sensor unit in accordance with some embodiments of a system for detecting or predicting a need for power line maintenance.

FIG. 2 illustrates an exemplary sensor unit 110. Here, sensor unit 110 is shown as being mechanically attached to line segment 116. The mechanical attachment is shown schematically in FIG. 2. Any suitable mechanical attachment techniques, including clamps, adhesives or any other suitable mechanisms, may be used to attach each sensor unit to a line segment.

Each sensor unit may contain a housing 250 that is environmentally sealed. Such a housing may be manufactured with any suitable materials, including materials as are used in the art for components used in exterior locations, such as may be found in power distribution systems and/or telephone systems.

Sensors and control circuitry may be enclosed within the housing 250. One or more types of sensors may be included in a sensor unit. In the example illustrated in FIG. 2, sensors for measuring electrical and mechanical properties are both included in sensor unit 110. A power line interface 210 may be included to sense electrical properties on line segment 116. In some embodiments, power line interface 210 may include components for sensing those electrical properties without direct electrical connection to line segment 116. For example, capacitive or inductive coupling between power line interface 210 and line segment 116 may be employed.

Regardless of the specific mechanism used to electrically couple sensor unit 110 to line segment 116, sensor unit 110 may include circuitry 212 for extracting electrical properties of the line segment. Circuitry 212 may use techniques as are known in the art to determine electrical properties, such as voltage or current on line 116. In this way, circuitry 212, in combination with power line interface 210, may act as a sensor for electrical properties.

Other mechanical properties may be measured. For example, FIG. 2 shows that sensor unit 110 includes thermocouple 214. Thermocouple 214 may be configured to measure the temperature of line 116 and output a signal reflecting the temperature.

Yet further sensors may measure inertial properties of line segment 116. In this example, inclinometer 218 and accelerometer 216 are included for measuring inertial properties. Because these sensors are coupled through housing 250 to line segment 116, the inclination or acceleration measured by these sensors reflect conditions on line segment 116. The inertial sensors may be constructed using techniques as are known in the art. For example, such sensors may be manufactured using microelectronic manufacturing techniques. Though, it should be appreciated that the specific construction of the inertial sensors is not critical to the invention.

Regardless of how the sensors may be are constructed, inclinometer 218 may output a signal representing a tilt of inclinometer 218, which, because of the mechanical coupling through housing 250 to line 116, may represent an amount of sag on line 116. Similarly, the output of accelerometer 216 may reflect acceleration on line 116. Other inertial sensors, such a sensor for velocity, alternatively or additionally may be included within sensor unit 110. Though, in some embodiments, other inertial measurements, such as velocity, may be derived from one or more of the inertial measurements made. For example, velocity may be derived through computations on outputs produced by accelerometer 216. As another example, measurements of an inertial property may be analyzed to obtain a rate of change of that inertial property. In turn, the rate of change of the inertial property may be used to determine a condition of the power line.

It should be appreciated that any of the above-mentioned sensors may be used to measure any of the above-described properties at any suitable time. Each sensor may measure properties that the sensor is configured to measure multiple times such that the sensor may produce a time-series of measurements of a time-varying characteristic. For example, thermocouple 214 may be configured to produce a time-series of temperature measurements. As another example, circuitry 212 may be configured to produce a time-series of measurements of a particular electrical property.

Regardless of the number and types of sensors within sensor unit 110, the outputs of the sensors may be collected by control circuitry 230. Control circuitry 230 may be implemented using circuitry design techniques as are known in the art. Control circuitry 230, for example, may be implemented as a programmable logic device programmed to perform techniques as described herein. In other embodiments, control circuitry 230 may be a general-purpose microcontroller or other processor that may be programmed through instructions stored in nonvolatile memory. As another option, control circuitry 230 may be custom designed circuitry such that it is programmed perform the processing described herein based on the layout of the circuit elements.

Regardless of the specific construction of control circuitry 230, control circuitry 230 may collect data from the sensors within sensor unit 110 and control transmitter 232 to transmit that data. In the example of FIG. 1, transmitter 232 may be configured to transmit data in accordance with a protocol recognized by computing device 150. In some embodiments, control circuitry 230 may process the data collected from the sensors prior to transmission.

That processing may include data compression or other processing operations. As one example, processing may include time-domain, frequency-domain, time-frequency domain, and/or time-scale domain analysis on time-varying outputs of one or more sensor units. For example, the time-scale domain analysis may include performing a wavelet analysis via one or more wavelet transforms as is known in the art. In some embodiments, the processing may be performed in accordance with a time-invariant wavelet transformation. The transformation may be a discrete-time wavelet transformation. Such a transformation may generate coefficients representing a signal collected at the output of a sensor such that transmission of the coefficients may convey useful information in the signal, but may consume a much lower bandwidth upon transmission. Though, it should be appreciated that any other suitable signal processing techniques (e.g., Fourier techniques, Gabor analysis, discrete cosine transform, etc.) may be applied to the outputs of the sensors.

Alternatively or additionally, processing may include tagging data prior to its transmission. The data may be tagged in any suitable way, such as by including data to indicate the line segment for which the data is collected. Tagging may also indicate a time at which the data was collected or any other parameters useful in analyzing the data including, but not limited to, parameters indicating how the data may have been processed prior to transmission.

Though FIG. 1 shows data being sent uni-directionally, from sensor units to a computing device, in some embodiments, two-way communication may be supported. In those embodiments, transmitter 232 may be a portion of a radio that also operates as a receiver. Information received may represent commands to sensor unit 110 to trigger sensor unit 110 to perform functions that it is already configured to perform or to reconfigure sensor unit 110 to perform additional functions. Commands received over a communications link, for example, may trigger sensor unit 110 to collect and/or report sensor measurements. Though, the specific commands to which sensor unit 110 may respond are not critical to the invention, and sensor unit 110 may be configured to respond to any suitable commands.

It should be appreciated that FIG. 2 is a simplified representation of a sensor unit. Other components may alternatively or additionally be included. For example, FIG. 2 illustrates that sensor unit 110 includes a power source, which is illustrated as charge storage device 240 in FIG. 2. Charge storage device 240, for example, may be a battery or a super capacitor. However, any suitable power source alternatively or additionally may be included.

Figure 3:
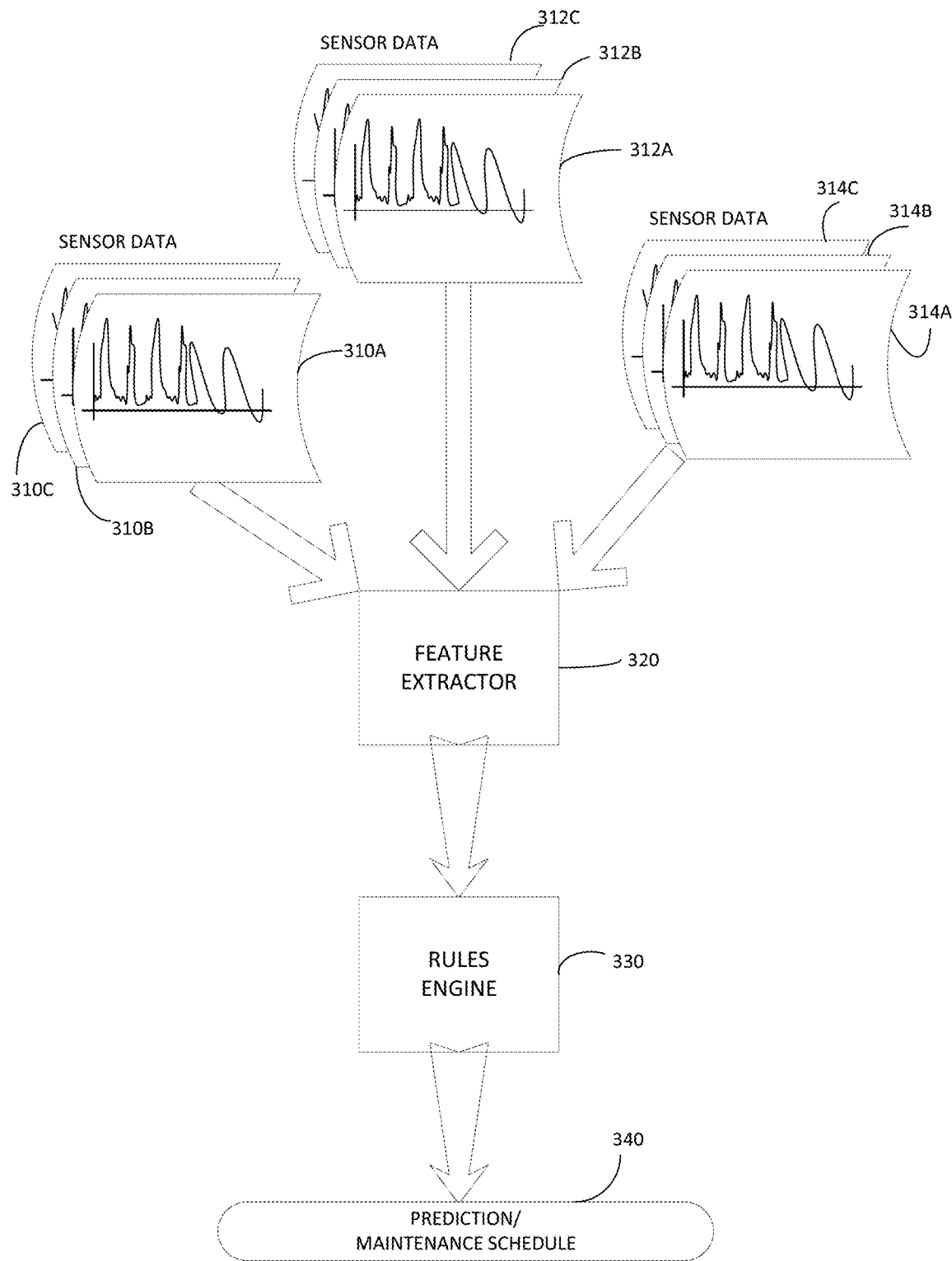
FIG. 3 is a functional block diagram of processing that may be performed on data collected by sensor units that are part of a system for detecting or predicting a need for power line maintenance.

Regardless of the specific makeup of the sensor units, FIG. 3 illustrates operation of a system in which multiple sensor units are deployed on line segments. FIG. 3 illustrates data collected from multiple sensor units. In this example, data collected from three sensor units, each containing three sensors of the same type, is illustrated. Data 310A, 310B and 310C represents data collected from three sensors in a first sensor unit. Data 312A, 312B and 312C represents data collected from three sensors in a second sensor unit. Data 314A, 314B and 314C represents data collected from three sensors in a third sensor unit. These data, for example, may represent electrical properties, thermal properties and inertial properties, such as acceleration, on each of the line segments to which a sensor unit is attached.

It should be appreciated that three sensor units, each with three sensors, is a simplified example. In some embodiments, data may be collected from many more sensors (e.g., at least 10, at least 100, at least 500, at least 1000, etc.) deployed throughout a power line network. Regardless of the number and type of sensors, the data from the sensors may be routed to a component 320 that performs feature extraction. Component 320 may be implemented within computing device 150, within the sensor units or in any other suitable location. In some embodiments, component 320 may be distributed, such that portions of the processing performed by feature extractor component 320 are performed in different computing devices and/or different locations throughout a power line management system.

Regardless of the specific device or devices that perform feature extraction, that processing may lead to identification of features in signals collected at the outputs of sensors. For example, analysis of the output of an accelerometer may lead to identification of features indicating oscillations of a line segment. As another example, analysis of the output of an inclinometer may lead to identification of features indicating sagging of a line segment. As yet further examples, analysis of the output of sensors measuring electrical properties may lead to identification of features indicating power glitches and/or any of numerous other operating states in the power line network.

Regardless of the specific features extracted by component 320, the identified features, alone or in combination with the collected sensor data, may be provided to a further component for analysis to identify or predict a condition indicating a need for maintenance on a line segment. In the example illustrated, that analysis may be performed by a rules engine 330, though, in other embodiments, that analysis may be performed using other techniques in addition to or instead of using a rules engine.

Rules engine 330 may be programmed in advance with rules for identifying conditions based on sensor data. Though, in some embodiments, rules engine 330 may be configured to accept rules in a format that can be generated by an operator of a network of power lines. In this way, the power line management system that may be readily configured for any specific location. As an example, when deployed in a windy environment, additional rules may be added to distinguish conditions attributable to normal wind versus conditions caused by a need for maintenance of power lines. When deployed in a snowy location, additional rules that define dangerous conditions due to snow or ice buildup on the power lines may be added.

Regardless of when and how rules are made available to rules engine 330, these rules may be applied to detect conditions such as:

a) Detection of ice on a conductor. Such a condition may be identified by detecting droop in the conductor based on a measurement from an inertial sensor such as an inclinometer. Measurements collected over a period of minutes (or hours) may be used to identify droop in the conductor. Detecting such a condition may be important for an operator of a power line network because it can result in total cable or pole/tower failure.

b) Detection of sag and stretch in the conductor due to excessive heating of the cable due to high current situations, which can result in unwanted contact with vegetation and trees. Such a scenario can create momentary or permanent power outages, or can ruin a cable, and force emergency replacement.

c) Determine the effects of wind on the conductor resulting in cable swinging and oscillation, which could result in unwanted contact with vegetation and trees which can create momentary or permanent power outages.

d) Detect 'galloping' of cables due to wind. This situation is the result of certain wind conditions (velocity, direction, duration), which can encourage a cable to oscillate at its resonant frequency, and eventually rip itself off the pole/tower, or actually initiate a pole/tower failure.

e) Detect the effects of high surge currents due to the violent nature of cables twisting, rotating, and lurching under the rapid current rush condition caused by power faults and lightning.

As can be seen from the foregoing examples, rules engine 330 may generate information 340 to identify or predict conditions requiring maintenance. The maintenance, for example, may include removing sag from a power line or removing obstacles, such as tree limbs from power lines. Though, other preventative actions may relate to operation of the power distribution system. For example, when numerous power lines throughout an area are loaded with snow or ice, an electric utility may plan for multiple power outages. Such planning may include advance preparation for repairs and/or proactively decoupling portions of the power line network to avoid transients on the network when power lines fail to avoid the even greater damage that might be caused by those transients. These and other actions may be taken in response to information 340.

As can also be seen from the foregoing examples, identifying or predicting conditions that require maintenance may be based on outputs from one or more sensors, which may be deployed in one or more locations. For example, some conditions may affect many of the lines in an area. For example, wind or snow and ice buildup is likely to impact many lines at the same time. Accordingly, such weather-related conditions may be detected using rules that define conditions that might exist on multiple line segments. Overload conditions also are likely to impact multiple line segments, particularly if those line segments form different portions of a single conductor. Accordingly, such conditions may be detected using rules defining conditions that might exist on multiple line segments.

On the other hand, rules to detect localized conditions may be based on the differences between the outputs of sensors in some locations versus others. For example, a tree branch contacting a line segment may result in accelerometer measurements with a different magnitude or frequency on that line segment than on other (e.g., nearby) line segments.

Accordingly, some or all of the rules may be based on correlations between measurements in different locations. Correlations between measurements of different type may also be reflected in the rules. For example, rules based on a correlation between inertial, electrical, and thermal measurements may be useful in predicting sag. As a specific example, a high incline measurement, correlated with a large measured current and a high temperature measurement, may indicate significant sag due to overload. As another specific example, a voltage transient measured at multiple sensors in combination with sensor units reporting a high degree of inclination, may indicate that one or more line segments has sagged to the point of breaking. As another specific example, detecting a recloser open and restore operation in conjunction with detecting rapid downward acceleration may indicate a downed conductor. As yet another example, detecting a large fault current event directly with a sudden torque on the line may indicate a ground fault condition.

One of skill in the art will recognize, that the above described capabilities to collect, correlate, and analyze outputs of multiple types of sensors at multiple locations may be employed to detect and/or predict other important conditions. Accordingly, the invention should not be limited to the specific conditions described as examples herein.

Figure 4:
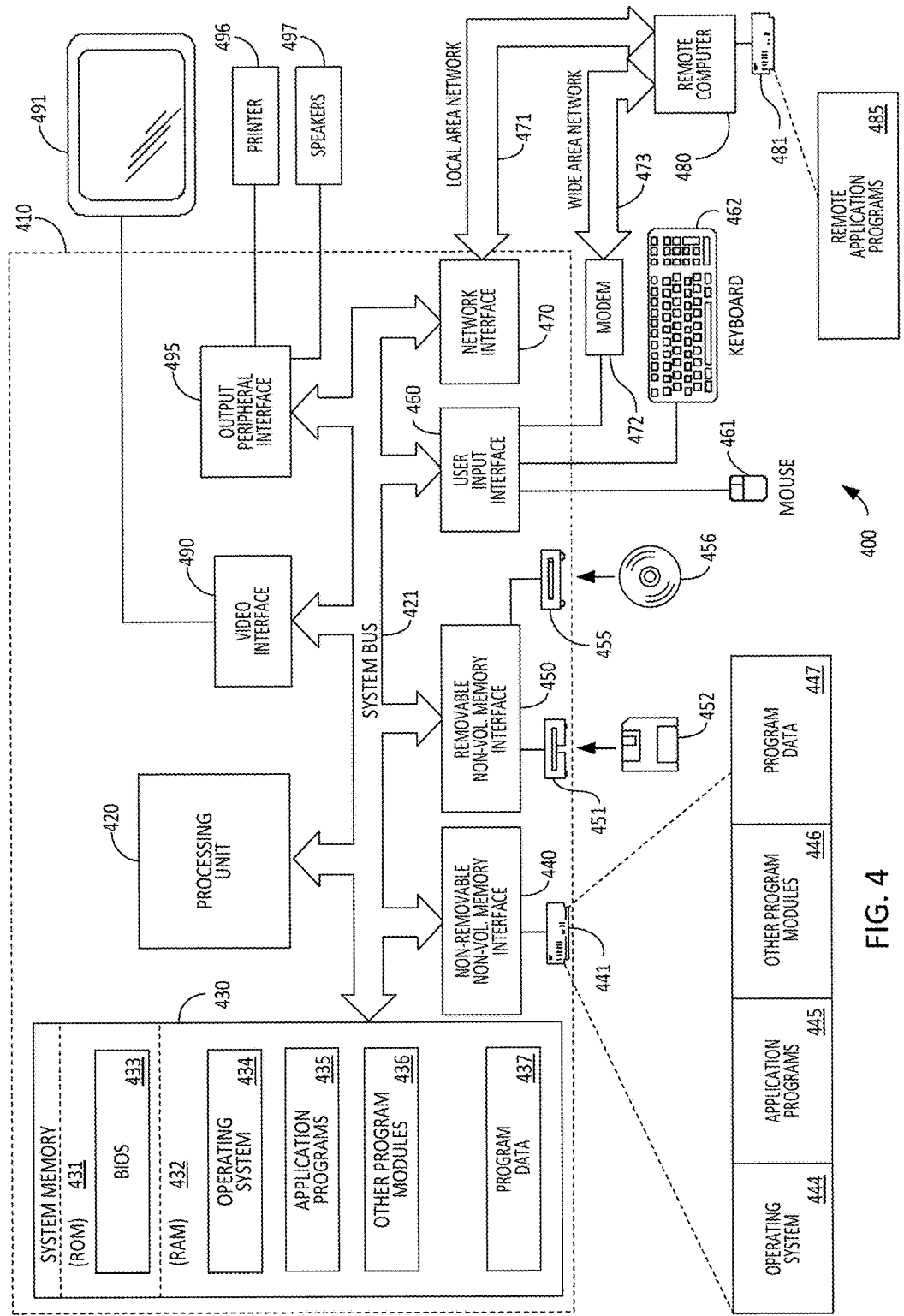
FIG. 4 is a block diagram of a computing device that may be configured to produce output based on a detected or predicted need for power line maintenance.

Moreover, it should be appreciated that processing as described herein is not limited to use of the specific components described herein. Nonetheless, FIG. 4 provides an example of a processing environment, such as may exist within computing device 150. FIG. 4 illustrates an example of a suitable computing system environment 400 on which the invention may be implemented. The computing system environment 400 is only one example of a suitable computing environment and is not intended to suggest any limitation as to the scope of use or functionality of the invention. Neither should the computing environment 400 be interpreted as having any dependency or requirement relating to any one or combination of components illustrated in the exemplary operating environment 400.

The invention is operational with numerous other general purpose or special purpose computing system environments or configurations. Examples of well-known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The computing environment may execute computer-executable instructions, such as program modules. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

With reference to FIG. 4, an exemplary system for implementing the invention includes a general purpose computing device in the form of a computer 410. Components of computer 410 may include, but are not limited to, a processing unit 420, a system memory 430, and a system bus 421 that couples various system components including the system memory to the processing unit 420. The system bus 421 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 410 typically includes a variety of computer readable media. Computer readable media can be any available media that can be accessed by computer 410 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 410. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 430 includes computer storage media in the form of volatile and/or nonvolatile memory such as read only memory (ROM) 431 and random access memory (RAM) 432. A basic input/output system 433 (BIOS), containing the basic routines that help to transfer information between elements within computer 410, such as during start-up, is typically stored in ROM 431. RAM 432 typically contains data and/or program modules that are immediately accessible to and/or presently being operated on by processing unit 420. By way of example, and not limitation, FIG. 4 illustrates operating system 434, application programs 435, other program modules 436, and program data 437.

The computer 410 may also include other removable/non-removable, volatile/nonvolatile computer storage media. By way of example only, FIG. 4 illustrates a hard disk drive 441 that reads from or writes to non-removable, nonvolatile magnetic media, a magnetic disk drive 451 that reads from or writes to a removable, nonvolatile magnetic disk 452, and an optical disk drive 455 that reads from or writes to a removable, nonvolatile optical disk 456 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 441 is typically connected to the system bus 421 through an non-removable memory interface such as interface 440, and magnetic disk drive 451 and optical disk drive 455 are typically connected to the system bus 421 by a removable memory interface, such as interface 450.

The drives and their associated computer storage media discussed above and illustrated in FIG. 4, provide storage of computer readable instructions, data structures, program modules and other data for the computer 410. In FIG. 4, for example, hard disk drive 441 is illustrated as storing operating system 444, application programs 445, other program modules 446, and program data 447. Note that these components can either be the same as or different from operating system 434, application programs 435, other program modules 436, and program data 437. Operating system 444, application programs 445, other program modules 446, and program data 447 are given different numbers here to illustrate that, at a minimum, they are different copies. A user may enter commands and information into the computer 410 through input devices such as a keyboard 462 and pointing device 461, commonly referred to as a mouse, trackball or touch pad. Other input devices (not shown) may include a microphone, joystick, game pad, satellite dish, scanner, or the like. These and other input devices are often connected to the processing unit 420 through a user input interface 460 that is coupled to the system bus, but may be connected by other interface and bus structures, such as a parallel port, game port or a universal serial bus (USB). A monitor 491 or other type of display device is also connected to the system bus 421 via an interface, such as a video interface 490. In addition to the monitor, computers may also include other peripheral output devices such as speakers 497 and printer 496, which may be connected through a output peripheral interface 495.

The computer 410 may operate in a networked environment using logical connections to one or more remote computers, such as a remote computer 480. The remote computer 480 may be a personal computer, a server, a router, a network PC, a peer device or other common network node, and typically includes many or all of the elements described above relative to the computer 410, although only a memory storage device 481 has been illustrated in FIG. 4. The logical connections depicted in FIG. 4 include a local area network (LAN) 471 and a wide area network (WAN) 473, but may also include other networks. Such networking environments are commonplace in offices, enterprise-wide computer networks, intranets and the Internet.

When used in a LAN networking environment, the computer 410 is connected to the LAN 471 through a network interface or adapter 470. When used in a WAN networking environment, the computer 410 typically includes a modem 472 or other means for establishing communications over the WAN 473, such as the Internet. The modem 472, which may be internal or external, may be connected to the system bus 421 via the user input interface 460, or other appropriate mechanism. In a networked environment, program modules depicted relative to the computer 410, or portions thereof, may be stored in the remote memory storage device. By way of example, and not limitation, FIG. 4 illustrates remote application programs 485 as residing on memory device 481. It will be appreciated that the network connections shown are exemplary and other means of establishing a communications link between the computers may be used.

Having thus described several aspects of at least one embodiment of this invention, it is to be appreciated that various alterations, modifications, and improvements will readily occur to those skilled in the art.

For example, embodiments are described in connection with a power distribution system used to deliver power from generation facilities to consumers of that power. The techniques described herein may be applied to Transmission and Distribution conductors in any setting. For example, power lines are used by the railway and streetcar industries, which may also have overhead conductors.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a computer-readable medium that can be considered to be a manufacture (i.e., article of manufacture) or a machine. Alternatively or additionally, the invention may be embodied as a computer readable medium other than a computer-readable storage medium, such as a propagating signal.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method, comprising:
   obtaining, using a first sensor unit coupled to a first power line in a power distribution system, at least one first measurement of at least one inertial property of the first power line;
   obtaining, using a second sensor unit different from the first sensor unit and coupled to a second power line different from the first power line, at least a second measurement of at least one inertial property of the second power line;
   detecting a weather condition affecting multiple power lines in an area at least in part by correlating a first feature obtained from the at least one first measurement with a second feature obtained from the at least one second measurement;
   scheduling maintenance on at least one of the multiple power lines in response to detecting the weather condition; and,
   performing maintenance on at least one of the multiple power lines in response to detecting the weather condition.

2. The method of claim 1, wherein detecting the weather condition comprises:
   generating the first feature from the at least one first measurement, the first feature indicating presence of sag in the first power line;
   generating the second feature from the at least one second measurement, the second feature indicating presence of sag in the second power line; and correlating the first feature with the second feature to infer that the weather condition is affecting multiple power lines in the area.

3. The method of claim 1, wherein detecting the weather condition comprises:
generating the first feature from the at least one first measurement, the first feature indicating swinging, oscillation, galloping, twisting, and/or rotation of the first power line;
generating the second feature from the at least one second measurement, the second feature indicating swinging, oscillation, galloping, twisting, and/or rotation of the second power line; and
correlating the first feature with the second feature to infer that the weather condition is affecting multiple power lines in the area.

4. The method of claim 1, wherein the at least one inertial property of the first power line comprises a property selected from the group consisting of velocity, acceleration, and inclination.

5. The method of claim 1, wherein the at least one first measurement of the at least one inertial property comprises a plurality of measurements of the at least one inertial property, and wherein the method further comprises generating the first feature at least in part by determining a rate of change of the at least one inertial property.

6. The method of claim 1, further comprising:
determining, using the first sensor unit, whether to transmit the at least one first measurement from the first sensor unit to another computing device; and
transmitting the at least one first measurement to the other computing device in response to determining that the at least one first measurement is to be transmitted.

7. The method of claim 1, wherein detecting the weather condition affecting multiple power lines in the area comprises determining that wind is affecting multiple power lines in the area.

8. The method of claim 1, wherein detecting the weather condition affecting multiple power lines in the area comprises determining that snow and/or ice build-up is affecting multiple power lines in the area.

9. The method of claim 1, wherein performing maintenance on at least one of the multiple power lines in response to detecting the weather condition further comprises:
decoupling one or more of the multiple power lines from the power distribution system in response to detecting the weather condition.

10. The method of claim 1, wherein scheduling maintenance on at least one of the multiple power lines in response to detecting the weather condition further comprises:
performing advance preparations to facilitate repairs on one or more of the multiple power lines in the area being affected by the weather condition.

* * * * *